United States Patent [19]
Bennett et al.

[11] Patent Number: 5,386,201
[45] Date of Patent: Jan. 31, 1995

[54] TEMPERATURE STABLE SQUARE WAVE OSCILLATOR

[75] Inventors: Paul T. Bennett, Phoenix; Randall C. Gray, Tempe; John Pigott, Phoenix, all of Ariz.

[73] Assignee: Motorola, Inc., Schaumburg, Ill.

[21] Appl. No.: 157,545

[22] Filed: Nov. 26, 1993

[51] Int. Cl.6 ............................................. H03L 1/02
[52] U.S. Cl. ........................................ 331/176; 331/66
[58] Field of Search .......... 331/111, 143, 176, DIG. 3, 331/135, 177 V, 66, 57

[56] References Cited
U.S. PATENT DOCUMENTS

| | | | |
|---|---|---|---|
| 4,603,308 | 7/1986 | Briefer | 331/143 |
| 4,667,171 | 5/1987 | Matthys | 331/66 |
| 4,898,462 | 2/1990 | Numata et al. | 356/70 |

OTHER PUBLICATIONS

Fletcher, William I., "An Engineering Approach To Digital Design", 1980 by Prentice-Hall, pp. 298-301.

*Primary Examiner*—Robert J. Pascal
*Assistant Examiner*—David H. Vu
*Attorney, Agent, or Firm*—Rennie W. Dover

[57] ABSTRACT

An oscillator circuit with enhanced frequency characteristics is provided. This oscillator circuit includes a buffer (102) to amplify the output signal and provide a positive feedback, an inverter (106) to provide negative feedback to cause oscillation, a capacitive divider circuit (110, 112) for charge storage, a resistor (116) to provide controlled discharge, and a diode circuit (114) for providing frequency stability. Since frequency stability is included within the oscillator circuit, there may be no need to perform resistor trimming at the time of manufacture. Further, the capacitive divider circuit eliminates parasitic charge injection.

13 Claims, 3 Drawing Sheets

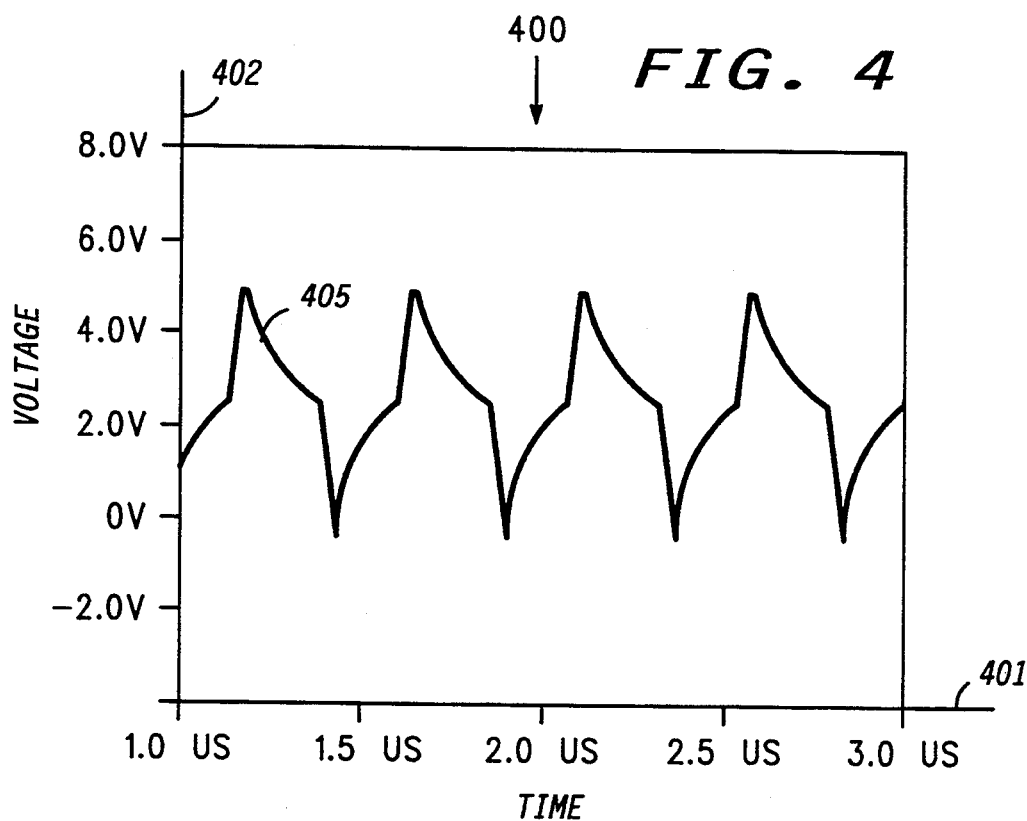
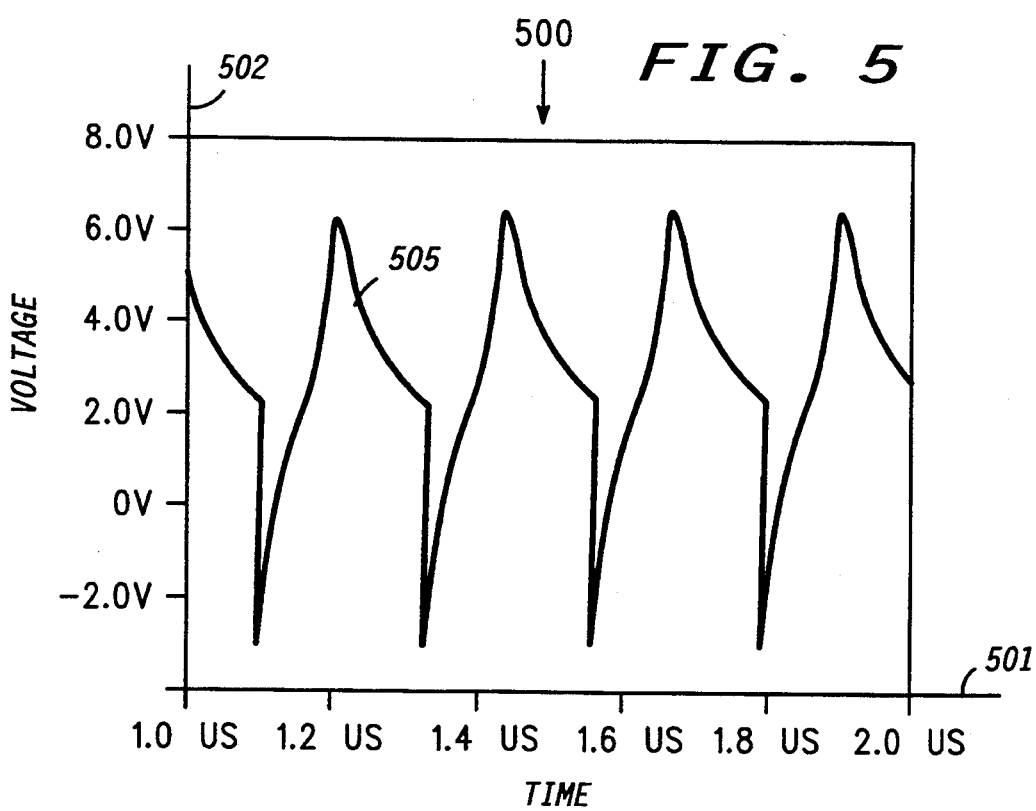

TEMPERATURE STABLE SQUARE WAVE OSCILLATOR

BACKGROUND OF THE INVENTION

This invention relates, in general, to circuits and, more particularly, to a square wave oscillator circuit.

A square wave oscillator is used for generating the clocking signal in synchronous digital systems such as computers, communications equipment, and electronic devices for automotive applications. In such applications, maintaining a stable clock frequency, thus oscillator frequency, is necessary for the proper operation of the equipment. The stable oscillator frequency must be maintained despite having wide temperature variations in the operating environment of the equipment such as under the hood of an automobile.

In the past, adjustments to obtain proper oscillator frequency were accomplished by various methods of trimming the resistance value of the oscillator circuit. However, trimming the resistance value at the time of manufacture of the oscillator does not provide frequency stability when the oscillator is operating in an environment of wide ranging temperature.

Hence, there exists a need for an oscillator which can maintain frequency stability while operating at a wide temperature range

BRIEF DESCRIPTION OF THE DRAWINGS

FIG. 4 is a graphic plot illustrating a voltage signal appearing at a node of the circuit of FIGS. 1 and 2 with respect to time; and FIG. 5 is a graphic plot illustrating a voltage signal at a node in a comparable prior art oscillator.

DETAILED DESCRIPTION OF THE DRAWINGS

Generally, the present invention provides a circuit for providing an oscillation signal having enhanced frequency characteristics. This is accomplished by a set of integrated components including a buffer to amplify the signal and provide positive feedback, an inverter for negative feedback to cause oscillation, a capacitive divider for charge storage, a resistor to provide a controlled discharge, and a set of diodes to provide frequency stability.

The output of the device provides a square-wave oscillation suitable for clocking digital circuitry. The frequency of operation remains relatively constant as operating temperature varies. The unit operates from a stable supply voltage and thus circuitry for compensating for supply voltage variation is not required.

Figure 1:
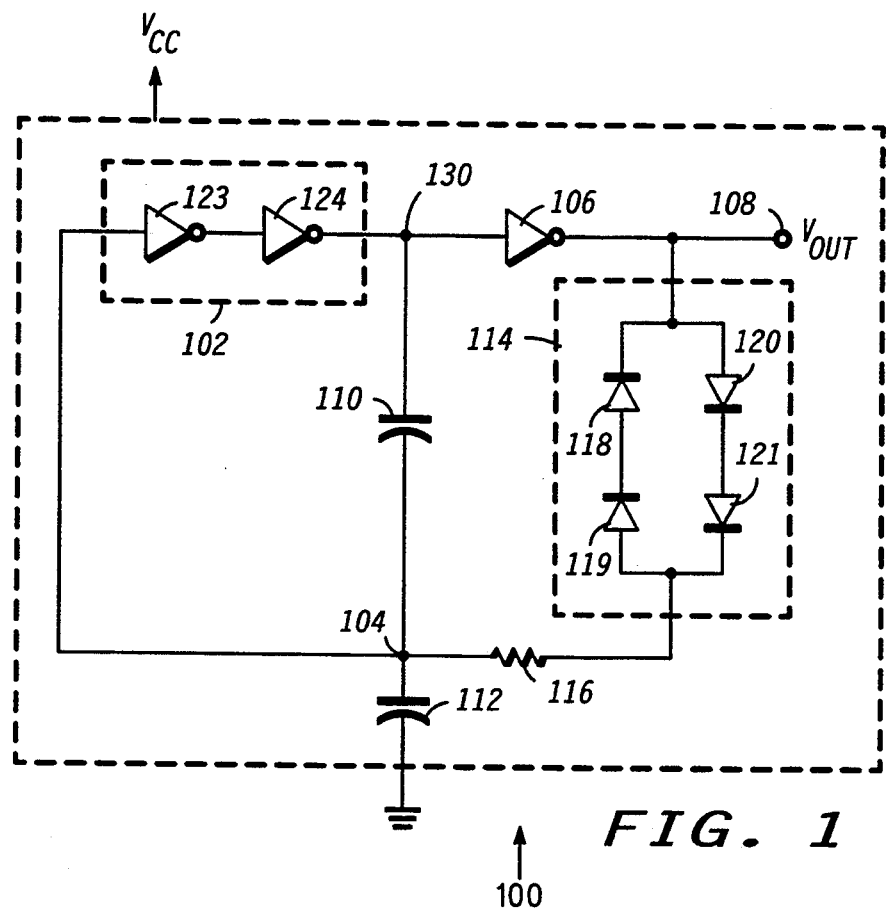
FIG. 1 is a block/schematic diagram illustrating a square wave oscillator circuit in accordance with the invention.

The present invention can be more fully described with references to FIGS. 1-4. In particular, FIG. 1 illustrates a detailed schematic/block diagram of oscillator circuit 100. Oscillator circuit 100 includes buffer circuit 102 having an input coupled to circuit node 104 and an output coupled to circuit node 130 which is coupled to an input of inverter circuit 106. An output of inverter 106 is coupled to terminal 108 for providing an oscillatory signal thereat.

Oscillator circuit 100 includes capacitor 110 coupled between the output of buffer circuit 102 and circuit node 104. Capacitor 112 is coupled between circuit node 104 and first supply voltage terminal at which ground reference is applied. It is worth noting that oscillator circuit 100 is coupled to a second supply voltage terminal at which the operating potential $V_{CC}$ is applied.

Oscillator circuit 100 also includes diode circuit 114 and resistor 116 for providing temperature compensation thereby improving the frequency characteristic of the signal appearing at terminal 108 with respect to variations in temperature. In particular, diode circuit 114 is coupled between the output of inverter 106 and a first terminal of resistor 116. The second terminal of resistor 116 is coupled to circuit node 104.

Diode circuit 114 includes diodes 118-121. Diode 118 has a cathode coupled to the output of inverter 106 and an anode coupled to the cathode to diode 119. The anode of diode 119 is coupled to the first terminal of resistor 116. Similarly, diode 120 has an anode coupled to the output of inverter 116 and a cathode coupled to the anode of diode 121. The cathode of diode 121 is coupled to the first terminal of resistor 116.

Buffer circuit 102 includes serially coupled inverters 123 and 124. The input of inverter 123 is coupled to circuit node 104 while its output is coupled to an input of inverter 124. Also, the output of inverter 124 is coupled to the output of buffer circuit 102.

In operation, buffer 102 detects and amplifies the signal at node 104 and drives node 130. If the voltage at node 104 is below the voltage threshold of 102, then the output at node 130 will be driven nearly equal to the ground potential.

Inverter 106 provides for inverting the signal at node 130 and driving the output node 108. If the input voltage at node 130 is equal to ground, the output node 108 is driven to the supply potential thus charging the capacitors 110 and 112 through the resistor 116 and diode circuit 114 (diodes 120 and 121).

The voltage at node 104 rises in a controlled manner determined by the time constant of the resistor 116, capacitors 110 and 112, voltage drop across diode circuit 114, and the voltage source at node 108 (output of inverter 106).

Once the voltage at node 104 rises above the voltage threshold of buffer 102, the voltage at node 130 changes from ground potential to the supply potential. The rise of the voltage at node 130 causes the voltage at node 104 to rise from the threshold potential to a higher potential. The voltage rise at node 104 is set by the ratio of capacitors 112 and 110. If the value of capacitor 112 is at least 67% of the value of capacitor 110 and the threshold of the buffer 102 is equal to approximately half the supply voltage, then the voltage at node 104 will not rise more than the supply voltage.

Once the voltage at node 130 has risen above the threshold of inverter 106, the voltage at the output node 108 switches to equal the ground potential thereby providing a square wave output. When the voltage at node 108 equals the ground potential, the capacitors 110 and 112 are discharged through resistor 116 and diode circuit 114 (diodes 118 and 119).

The voltage at node 104 falls in a controlled manner determined by the time constant of the resistor 116, capacitors 110 and 112, voltage drop across diode circuit 114, and the voltage source at node 108 (output of inverter 106).

Once the voltage at node 104 drops below the voltage threshold of buffer 102, the voltage at node 130 changes from supply potential to ground. The drop of the voltage at node 130 causes the voltage at node 104 to drop from the threshold potential to a lower potential. The voltage drop at node 104 is set by the ratio of capacitors 112 and 110 as previously described. Note that the voltage drop at node 104 can be prevented from dropping below the ground potential. Thus, the present invention constrains the voltage at node 104 to stay within the supply rails thereby preventing parasitic charge injection into the resistor junction isolation regardless of the type of resistor used in the integrated circuit.

Buffer 102 and an inverter 106 should provide high input impedance (i.e. low capacitive loading) and low output impedance (good drive capability). The gain of the buffer must be sufficient to ensure oscillation. The buffer 102 may be formed by combining an even number of inverters connected in series, see inverters 123 and 124 forming buffer 102 in FIG. 1. Inverter 106 in FIG. 1 may be formed by combining an odd number of inverters connected in series. The inverters should be sized appropriately with small inverters forming the input stage and larger inverters forming the output stage as commonly used for buffering and inverting stages.

The value of resistor 116 increases as temperature increases. The value can be approximated by the following equation:

$$R116(@T) = R116(@27C) * (1 + (530E-6) * T + (3.5E-6) * T^2)$$

Note that the variation of the resistance is slightly parabolic. The voltage drop across the diode circuit 114 varies inversely with temperature and is equal to −2 mV per degree centigrade. The increasing value of resistance is compensated for by the decreasing value of the voltage drop across the diodes thereby providing substantially equal net charging and discharging currents. It should be appreciated that all diffusion resistors exhibit a positive temperature variance and may be compensated for by a diode circuit including one or more series connected diodes.

It should also be noted that diode circuit 114 comprising diodes 118, 119, 120 and 121 may be further connected in pairs without substantially changing the operation. That is, in addition to the configuration shown in FIG. 1 for diode circuit 114, the anode of diode 118 may also be coupled to the cathode of diode 120. It is worth noting that other diode configurations may be used as required to achieve the best frequency compensation for a given process.

Figure 2:
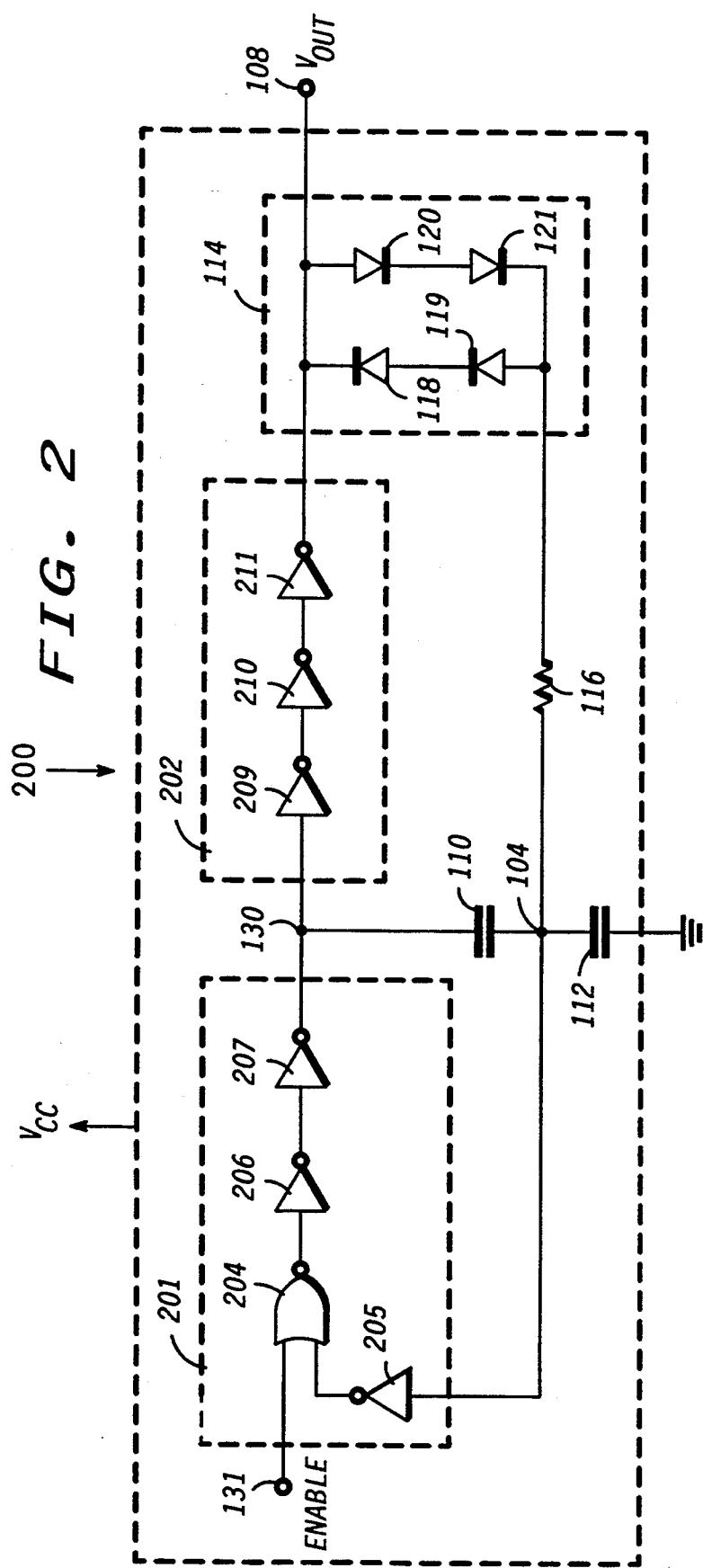
FIG. 2 is a detailed schematic/block diagram of an alternate embodiment of a square wave oscillator circuit in accordance with the present invention.

FIG. 2 illustrates a detailed schematic/block diagram of the oscillator circuit 200. Oscillator circuit 200 is an alternate embodiment of the present invention. Components shown in FIG. 2 that are identical to components shown in FIG. 1 are identified by the same or similar reference numbers.

Oscillator circuit 200 includes buffer circuit 201 which is responsive to control signal ENABLE and has an input and an output. The input of buffer circuit 201 is coupled to circuit node 104 while the output of buffer circuit 201 is coupled to an input of inverter circuit 202.

The output of inverter circuit 202 is coupled to terminal 108 for providing an oscillatory signal thereat.

Buffer circuit 201 includes logic gate 204 for an enabling oscillator circuit 200. A first input of gate 204 is coupled to for receiving signal enable while a second input of gate 204 is coupled to an output of inverter 205. The output of gate 204 is coupled to an input of inverter 206 the output of which is coupled to an input of inverter 207. The output of inverter 207 is coupled to an output of buffer circuit 201. An input of inverter 205 is coupled to the input of buffer circuit 201.

Inverter circuit 202 includes a plurality of serially coupled inverters 209–211. The input of inverter 209 is coupled to an input of inverter circuit 202 while the output of inverter 209 is coupled to an input of inverter 210. The output of inverter 210 is coupled to an input of inverter 211 the latter of which has an output coupled to the output of inverter circuit 202.

In operation, buffer 201 includes a logic NOR gate 204 to enable and disable the oscillator 200. If the enable signal at node 131 is high, it is desired to disable oscillator 200. As a result, the output of the logic gate 204 is low regardless of the signal at the output of inverter 205. Further, the voltage at node 130 falls to the ground potential and the output at node 108 rises to the supply potential and remains high until the enable signal is asserted low (enable oscillator). The oscillator draws significantly less current when disabled (practically zero if no leakage current in CMOS gates).

When the enable signal at node 131 is low, it is desired to enable oscillator 200. Thus, the buffer 201 acts as previously described for oscillator 100. Note here that buffer 201 comprises an even number of inverting stages wherein NOR gate 204 acts as a fourth inverter.

Note that inverter 202 comprises an odd number of inverting stages. The first inverter 209 is built to have low input capacitance by using the minimum gate and channel sizes. The second inverter 210 is sized larger to amplify the signal while not significantly loading the first inverter 209. The third inverter 211 is sized still larger than inverter 210 to provide a low output impedance. Thus the output impedance of inverter 202 is low enough not to interfere with the resistor 116 and diode means 114 which control the charging and discharging of the capacitors 110 and 112.

Further note that the diode circuit 114 includes diode pairs 119, 121 and 118, 120 as described previously.

Figure 3:
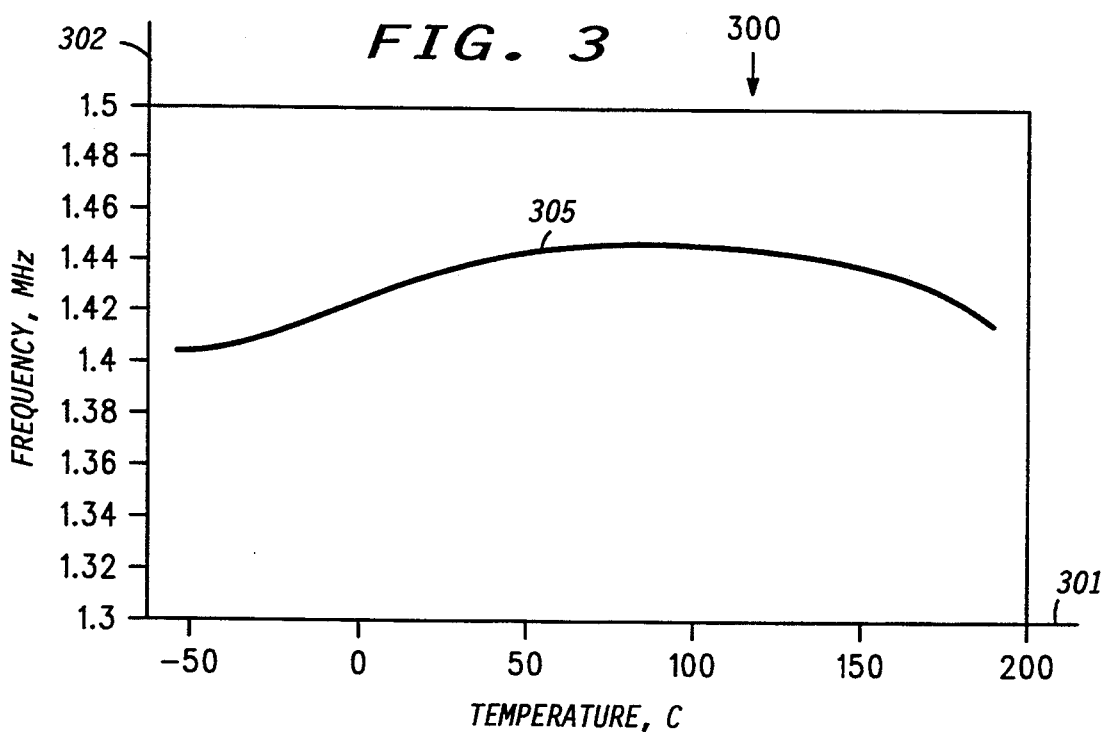
FIG. 3 is a graphic plot illustrating the frequency response of an output signal of the oscillator circuit of FIGS. 1 and 2 with respect to temperature.

FIG. 3 is a pictorial diagram illustrating the frequency response of a signal appearing at node 108 of oscillator circuit 200 with respect to temperature variation. Pictorial diagram 300 includes horizontal axis 301 for showing temperature and vertical axis 302 for showing frequency. Lines segment 305 shows the frequency oscillation of a signal appearing at node 108 of oscillator circuit 200 over a wide variation of temperature.

From FIG. 3, it is clear that the frequency of oscillation of a signal appearing at terminal 108 of oscillator circuit 200 varies minimally over a wide range of temperature as shown on horizontal axis 301.

FIG. 4 is a pictorial diagram illustrating a voltage signal appearing at circuit node 104 of oscillator circuit 200. Pictorial diagram 400 includes horizontal axis 401 for showing time and vertical axis 402 for showing voltage. Waveform 405 shows a simulated voltage waveform of a voltage signal appearing at node 104 of oscillator circuit 200 over time. It is important to note that the voltage signal 405 neither goes above or below the voltage supply rails which are respectively 0 volts (ground) and 5 volts ($V_{CC}$).

On the contrary, FIG. 5 is a pictorial diagram illustrating a voltage signal appearing at a node (comparable to node 104) of a prior art oscillator (not shown). Pictorial diagram 500 includes horizontal axis 501 for showing time and vertical axis 502 for showing voltage. Waveform 505 shows a simulated voltage waveform of a voltage signal appearing at a node (comparable to node 104 of oscillator circuit 200) for a prior art oscillator. It is important to note that the voltage signal 505 does in fact swing above and below the voltage supply rails which again are respectively 0 and 5 volts. Thus, from FIGS. 4 and 5, one can clearly see that capacitors 110 and 112 of the present invention provide a voltage signal at circuit node 104 that is more controlled than the prior art thereby preventing parasitic charge injection to resistor 116.

The present invention provides a circuit for providing an oscillatory signal having minimal frequency variation over a wide range of temperature. With such a circuit one overcomes two of the primary problems with fully integrating the circuit. First, the capacitive divider 110 and 112 keeps the voltage at node 104 from rising above and below the supply rails. If the voltage were allowed to rise above the supply rail, the normally reverse biased junction below resistor 116 would forward bias, inject undesirable carriers into the epi region and disturb the frequency response of the oscillator.

Second, diode circuit 114 stabilizes the frequency of an output signal over a temperature range. The temperature variance of resistor 116 tends to shirt the oscillation frequency by disturbing the charging and discharging rate of capacitors 110 and 112. As an example, in FIG. 3, the resistor variation alone, if plotted, would completely cover the y-axis 302 (14% variance from cold to hot). Moreover, simulated results of the oscillator without the diode means 114 indicate a frequency variance much greater than that due to the resistance variance alone (25% variance from cold to hot). The additional variance is probably due to the variance of the voltage threshold of buffer 201. However, the present invention includes diode means 114 for compensating the temperature variance of the output signal by effectively changing the voltage source driving resistor 116. The measured frequency variance is better than 1.5% from cold to hot.

Nominal frequency variation due to manufacturing process variation of capacitor and resistor values is commonly compensated for by integrating "trim" resistors in series with (or parallel with, or in place of ) the primary resistor. Many methods for trimming resistors exist, one commonly used method is to form a series of resistors with metal fuses shorting across each resistor. The metal fuses may be opened up by passing current through the fuse thus opening the fuse up which effectively places the resistor into the circuit.

We have noted that by providing the means of frequency stability, thus realizing much improved frequency variation, there exists no need for "trimming" the nominal frequency variation to meet our design objective, thus saving the significant "trimming" cost.

Furthermore the capacitive divider provides a means for eliminating parasitic charge injection at the coupling resistor node. The resistor body being of P type is diffused into an epi island of N type forming a parasitic diode (junction isolated process). The epi island, biased at the most positive supply potential, maintains the resistor reverse biased as long as both of the resistor terminals remain below or equal to the supply voltage. The capacitive voltage divider provides a means for ensuring that the resistor terminals remain less than the supply voltage.

A fully integrated temperature stable oscillator requiring no external components has been presented. It should be appreciated by now that we have shown a simple fully integrated circuit for stabilizing the frequency variation of a square wave oscillator.

While specific embodiments of the present invention have been described, further modifications and improvements will occur to those skilled in the art. It is understood that the invention is not limited to the particular forms shown and it is intended for the appended claims to cover all modifications which do not depart from the spirit and scope of this invention.

We claim:

1. An oscillator circuit, comprising:
   a plurality of serially coupled inverters each having an input coupled to an output of a previous one of said plurality of serially coupled inverters, an output of a last one of said plurality of serially coupled inverters for providing an output signal;
   a first capacitor coupled between an input of said last one of said plurality of serially coupled inverters and an input of a first one of said plurality of serially coupled inverters;
   circuit means coupled between said output of said last one of plurality of serially coupled inverters and said first capacitor for providing temperature compensation; and
   capacitive means coupled to said first capacitor for reducing a voltage swing thereat.

2. The oscillator circuit according to claim 1 wherein said circuit means includes:
   a resistor having first and second terminals, said first terminal of said resistor coupled to said first capacitor; and
   at least one diode coupled between said output of said last one of said plurality of serially coupled inverters and said second terminal of said resistor.

3. The oscillator circuit according to claim 2 wherein said circuit means prevents substrate injection associated with said resistor.

4. The oscillator circuit according to claim 1 wherein said capacitive means is a capacitor coupled between said first capacitor and a first supply voltage terminal.

5. The oscillator circuit according to claim 1 wherein a first portion of said plurality of serially coupled inverters functions as a buffer circuit and wherein a second portion of said plurality of serially coupled inverters functions as an inverter circuit.

6. An oscillator circuit, comprising:
   a buffer circuit having an input and an output;
   an inverter circuit having an input and an output, said input of said inverter circuit coupled to said output of said buffer circuit, said output of said inverter circuit for providing an output signal;
   a first capacitor coupled between said output of said inverter circuit and said input of said buffer circuit;
   circuit means coupled between said output of said inverter circuit and said input of said buffer circuit for providing temperature compensation; and
   a second capacitor coupled to said input of said buffer circuit for reducing a voltage swing thereat.

7. The oscillator circuit according to claim 6 wherein said buffer circuit includes an even number of serially coupled inverters.

8. The oscillator circuit according to claim 6 wherein said inverter circuit includes an odd number of serially coupled inverters.

9. The oscillator circuit according to claim 6 wherein said buffer circuit includes means responsive to a signal for an enabling the oscillator circuit.

10. The oscillator circuit according to claim 6 wherein said circuit means includes:
   a resistor having first and second terminals, said first terminal of said resistor coupled to said first capacitor; and
   a diode circuit coupled between said output of said inverter circuit and said second terminal of said resistor.

11. The oscillator circuit according to claim 10 wherein said diode circuit includes:
   a first diode having an anode and a cathode, said anode of said first diode coupled to said output of said inverter circuit;
   a second diode having an anode and a cathode, said anode of said second diode coupled to said cathode of said first diode, said cathode of said second diode coupled to said second terminal of said resistor;
   a third diode having an anode and a cathode, said cathode of said third diode coupled to said output of said inverter circuit; and
   a fourth diode having an anode and a cathode, said cathode of said fourth diode coupled to said anode of said third diode, said anode of said fourth diode coupled to said second terminal of said resistor.

12. The oscillator circuit according to claim 6 wherein said buffer circuit has a low output impedance and for providing a non-inverting gain.

13. The oscillator circuit according to claim 6 wherein said inverter circuit has a low output resistance and for providing an inverting gain.

* * * * *